US012604479B2

(12) United States Patent
Sato et al.

(10) Patent No.: US 12,604,479 B2
(45) Date of Patent: Apr. 14, 2026

(54) TWO TRANSISTOR CAPACITORLESS MEMORY CELL WITH STACKED THIN-FILM TRANSISTORS

(71) Applicant: INTEL CORPORATION, Santa Clara, CA (US)

(72) Inventors: Noriyuki Sato, Hillsboro, OR (US); Abhishek A. Sharma, Hillsboro, OR (US); Van H. Le, Beaverton, OR (US); Hui Jae Yoo, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 1067 days.

(21) Appl. No.: 17/471,295

(22) Filed: Sep. 10, 2021

(65) Prior Publication Data

US 2023/0084611 A1     Mar. 16, 2023

(51) Int. Cl.
| | |
|---|---|
| *H01L 23/31* | (2006.01) |
| *H10B 51/30* | (2023.01) |
| *H10D 30/01* | (2025.01) |
| *H10D 30/69* | (2025.01) |

(52) U.S. Cl.
CPC ......... *H10B 51/30* (2023.02); *H10D 30/0415* (2025.01); *H10D 30/701* (2025.01)

(58) Field of Classification Search
CPC .... H10B 51/30; H10B 12/00; H10D 30/0415; H10D 30/701; H10D 30/6755
USPC ....................................................... 257/295
See application file for complete search history.

(56) References Cited

U.S. PATENT DOCUMENTS

| | | | | |
|---|---|---|---|---|
| 6,242,771 B1 * | 6/2001 | Hsu | ................... | H01L 21/02175 257/295 |
| 6,610,548 B1 * | 8/2003 | Ami | ........................ | C30B 29/16 257/E21.279 |
| 10,468,432 B1 * | 11/2019 | Han | ........................ | H10B 63/22 |
| 11,018,264 B1 | 5/2021 | Gomes et al. | | |
| 11,056,492 B1 | 7/2021 | Gomes et al. | | |
| 11,087,832 B1 | 8/2021 | Gomes et al. | | |
| 2002/0149042 A1 * | 10/2002 | Tarui | ................... | H10D 30/701 257/295 |
| 2006/0051910 A1 * | 3/2006 | Tanabe | ................... | H10B 53/30 438/152 |
| 2006/0205156 A1 * | 9/2006 | Mouli | ................... | H01L 21/765 257/E21.654 |
| 2009/0057745 A1 * | 3/2009 | Yin | ........................ | H10D 86/01 257/E21.422 |
| 2011/0008931 A1 * | 1/2011 | Yamazaki | .......... | H10D 30/6755 438/104 |
| 2013/0341753 A1 * | 12/2013 | Lee | ........................ | H10B 63/30 257/E27.072 |
| 2014/0209850 A1 * | 7/2014 | Ogimoto | ............ | G11C 13/0007 257/4 |

(Continued)

*Primary Examiner* — Sheikh Maruf
(74) *Attorney, Agent, or Firm* — Akona IP PC

(57) ABSTRACT

Described herein are memory cells that include two transistors stacked above one another above a support structure where neither one of the transistors is coupled to a capacitor and where at least one of the two transistors is a thin-film transistor. In such 2T capacitorless memory cells, a first transistor may be referred to a write transistor, and a second transistor may be a read transistor. The first transistor may be a three-terminal device having two S/D terminals and a gate terminal, while the second transistor may be a four-terminal device having two S/D terminals and two gate terminals.

20 Claims, 9 Drawing Sheets

(56)     References Cited

U.S. PATENT DOCUMENTS

| | | | |
|---|---|---|---|
| 2016/0056301 A1* | 2/2016 | Lee | H10D 30/701 |
| | | | 257/295 |
| 2017/0243640 A1* | 8/2017 | Jeong | G11C 16/3418 |
| 2017/0294225 A1* | 10/2017 | Tailliet | H10D 64/514 |
| 2017/0373067 A1* | 12/2017 | Kimura | H10D 30/6755 |
| 2018/0006129 A1* | 1/2018 | Xing | H10D 30/6739 |
| 2018/0301624 A1* | 10/2018 | Yang | H10B 63/30 |
| 2019/0259761 A1* | 8/2019 | Takemura | H10D 86/60 |
| 2019/0273087 A1* | 9/2019 | Morris | H10D 64/689 |
| 2019/0273119 A1* | 9/2019 | Zhou | H10B 63/30 |
| 2019/0318775 A1* | 10/2019 | Rakshit | G11C 11/221 |
| 2020/0035683 A1 | 1/2020 | Sharma et al. | |
| 2020/0091156 A1* | 3/2020 | Sharma | H10D 86/423 |
| 2020/0212224 A1* | 7/2020 | Penumatcha | H10D 64/689 |
| 2021/0125990 A1 | 4/2021 | Gomes et al. | |
| 2021/0134802 A1 | 5/2021 | Gomes et al. | |
| 2021/0151438 A1 | 5/2021 | Gomes et al. | |
| 2021/0159229 A1 | 5/2021 | Gomes et al. | |
| 2021/0174858 A1* | 6/2021 | Joshi | G11C 7/1006 |
| 2021/0202484 A1* | 7/2021 | Hwu | H10B 43/10 |
| 2021/0398992 A1* | 12/2021 | Wu | H10D 64/033 |

* cited by examiner

RBL
222

220

RWL
224

S

D

SN
230

G

WWL
214

G

D

WBL
212

S

210

200

SECOND TRANSISTOR LAYER
106

FIRST TRANSISTOR LAYER
104

FEOL LAYER
103

SUPPORT STRUCTURE
102

100

500

PROVIDE A WWL OVER A SUPPORT STRUCTURE
502

FORM A FIRST TRANSISTOR OVER AND COUPLED TO THE WWL
504

PROVIDE A WBL OVER THE FIRST TRANSISTOR
506

PROVIDE A CONTACT OVER AND COUPLED TO THE FIRST TRANSISTOR
508

PERFORM A LAYER TRANSFER OF A SINGLE-CRYSTALLINE SEMICONDUCTOR
510

FORM A SECOND TRANSISTOR OVER AND COUPLED TO THE CONTACT
512

PROVIDE A RBL AND A RWL COUPLED TO THE SECOND TRANSISTOR
514

FIG. 5

TWO TRANSISTOR CAPACITORLESS MEMORY CELL WITH STACKED THIN-FILM TRANSISTORS

BACKGROUND

Embedded memory is important to the performance of modern system-on-a-chip (SoC) technology. Low power and high density embedded memory is used in many different computer products and further improvements are always desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 5 is a flow diagram of a method of manufacturing an IC device implementing 2T capacitorless memory cells with stacked TFTs, according to some embodiments of the present disclosure.

DETAILED DESCRIPTION

Figures 1, 2:
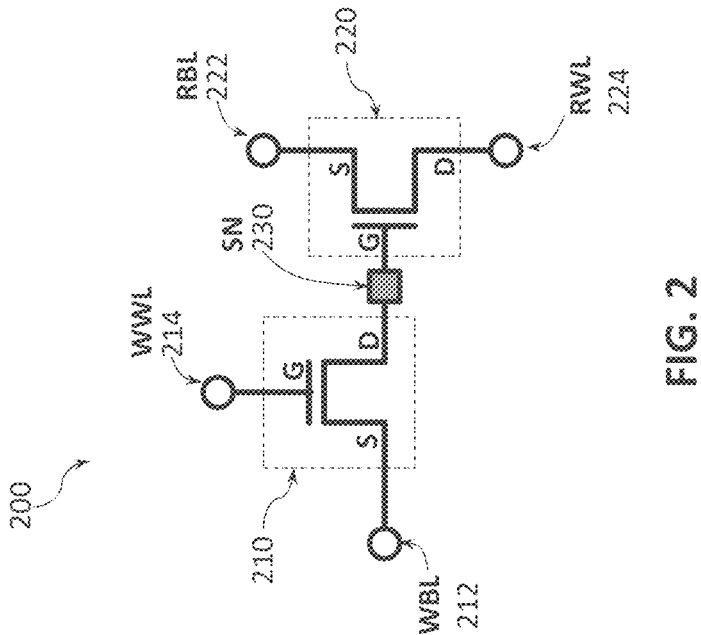
FIG. 1 is a schematic illustration of an integrated circuit (IC) device in which two transistor (2T) capacitorless memory cells with stacked thin-film transistors (TFTs) may be implemented, according to some embodiments of the present disclosure.
FIG. 2 is an electric circuit diagram of a 2T capacitorless memory cell that may be implemented as one of the memory cells of a memory array of the IC device of FIG. 1, according to some embodiments of the present disclosure.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating IC devices implementing 2T capacitorless memory cells with stacked TFTs as described herein, it might be useful to first understand phenomena that may come into play in certain IC arrangements. The following foundational information may be viewed as a basis from which the present disclosure may be properly explained. Such information is offered for purposes of explanation only and, accordingly, should not be construed in any way to limit the broad scope of the present disclosure and its potential applications.

Some memory devices may be considered "standalone" devices in that they are included in a chip that does not also include compute logic (where, as used herein, the term "compute logic devices" or simply "compute logic" or "logic devices," refers to IC components, e.g., transistors, for performing computing/processing operations). Other memory devices may be included in a chip along with compute logic and may be referred to as "embedded" memory devices. Using embedded memory to support compute logic may improve performance by bringing the memory and the compute logic closer together and eliminating interfaces that increase latency. Various embodiments of the present disclosure relate to embedded memory arrays, as well as corresponding methods and devices.

Embodiments of the present disclosure relate to memory cells that include two transistors (hence, the memory cells are referred to as "2T memory cells") stacked above one another above a support structure (e.g., a substrate, a die, a wafer, or a chip), where neither one of the transistors is coupled to a deliberately included capacitor (hence, the memory cells are referred to as "capacitorless") and where at least one of the two transistors is a TFT. In such 2T capacitorless memory cells with stacked TFTs, a first transistor may be referred to as a "write transistor" (or, alternatively, as an "access transistor") and a second transistor may be referred to as a "read transistor" (or, alternatively, as a "gain transistor"). In the following, the term "above" refers to being further away from the support structure of an IC device that includes one or more (typically a plurality) of 2T capacitorless memory cells, while the term "below" refers to being closer towards the support structure of the IC device.

A first one of a source terminal and a drain terminal (together referred to as "S/D terminals") of a write transistor may be coupled to a gate terminal of the read transistor, the second S/D terminal of the write transistor may be coupled to a write bit-line (WBL), and the gate terminal of the write transistor may be coupled to a write word-line (WWL). A first one of the S/D terminals of the read transistor may be coupled to a read word-line (RWL), while the second S/D terminal of the read transistor may be coupled to a read bit-line (RBL). A memory state, or a bit value (i.e., logical "1" or "0") of such a memory cell may be represented by charge indicative of the bit value, stored in the so-called "storage node" between (i.e., coupled to) the gate terminal of the read transistor and the first S/D terminal of the write transistor. The write transistor may be used for programming a bit value in a 2T memory cell (i.e., writing a bit value to the memory cell by storing the charge indicative of the bit value in the storage node). The read transistor may be used for reading a 2T memory cell (i.e., determining the bit value that was stored in the memory cell). Since a 2T memory cell can be fabricated with as little as two transistors, it can provide higher density and lower standby power compared to other types of memory cells in the same process technology.

In some embodiments, the first transistor may be a three-terminal device having two S/D terminals and a gate terminal, while the second transistor may be a four-terminal device having two S/D terminals and two gate terminals (i.e., the second transistor may be a dual-gated device). One of the gate terminals of the second transistor may be coupled to one of the S/D terminals of the first transistor, while the other one of the gate terminals of the second transistor may be coupled to a voltage source so that a voltage may be applied to the second gate terminal of the second transistor in order to, e.g., change the threshold voltage of the second transistor.

In some embodiments, the read transistor may be stacked above the write transistor. In some such embodiments, both the read and write transistors may be TFTs. In other such embodiments, the write transistor may be a TFT, while the read transistor may be a transistor having a channel material that includes a substantially single-crystalline semiconductor material, in which case the channel material of the second transistor may be provided over the write transistor using layer transfer. A TFT is a special kind of a field-effect transistor made by depositing a thin-film of an active semiconductor material, as well as a dielectric layer and metallic contacts, over a support layer (or, simply, a "support") that may be a non-conducting and a non-semiconducting layer. At least a portion of the active thin-film semiconductor material forms a channel material of the TFT. Thin-film semiconductor materials are typically polycrystalline, polymorphous, or amorphous semiconductor materials, which is different from single-crystalline semiconductor materials that may be epitaxially grown on semiconductor substrates. TFTs are particularly suitable for being included in a back end of line (BEOL) portions of IC devices because thin-film channel materials may be deposited at relatively low temperatures, compared to the relatively high temperatures required for epitaxially growing single-crystalline semiconductor materials. Thus, TFTs are different from conventional, non-TFT, front end of line (FEOL) transistors where the active semiconductor channel material is typically a part of a semiconductor substrate, e.g., a part of a silicon wafer. 2T capacitorless memory cells with stacked TFTs, described herein, may be used, for example, to address the scaling challenge of logic transistor (e.g., FEOL) based embedded DRAM (eDRAM) technology and enable high density embedded memory in an advanced complementary metal-oxide-semiconductor (CMOS) process.

Implementing some transistors of 2T capacitorless memory cells as TFTs may have the advantages of the reduced leakage and/or less expensive fabrication. On the other hand, implementing some transistors of 2T capacitorless memory cells using layer transfer to provide substantially single-crystalline semiconductor channel materials may have the advantages of faster operation of such transistors, due to carrier mobility being higher in single-crystalline semiconductor materials, compared to carrier mobility in polycrystalline, polymorphous, or amorphous semiconductor materials (i.e., in thin-film channel materials). Whether a semiconductor channel material of a given transistor is a thin-film channel material or a single-crystalline semiconductor material may be identified by inspecting the grain size of the material. An average grain size of the semiconductor material being between about 0.5 and 1 millimeters (in which case the material may be polycrystalline), or smaller than about 0.5 millimeter (in which case the material may be polymorphous), or even smaller (in which case the material may be amorphous), may be indicative of the semiconductor material having been deposited at the relatively low temperatures (i.e., indicative of the transistor being a TFT). On the other hand, an average grain size of the semiconductor material being equal to or greater than about 1 millimeter (in which case the material may be considered to be a substantially single-crystalline material) may be indicative of the semiconductor material having been provided in the BEOL of an IC device by layer transfer.

Other technical effects will be evident from various embodiments described here.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. As used herein, a "logic state" (or, alternatively, a "state" or a "bit" value) of a memory cell may refer to one of a finite number of states that the cell can have, e.g., logic states "1" and "0," each state represented by a different charge, or a range of charges, stored in a storage node of the cell, while "READ" and "WRITE" memory access or operations refer to, respectively, determining/sensing a logic state of a memory cell and programming/setting a logic state of a memory cell.

Furthermore, some descriptions may refer to a particular source or drain region of a transistor being either a source region or a drain region. However, unless specified otherwise, which region of a transistor is considered to be a source region and which region is considered to be a drain region is not important because, as is common in the field of field-effect transistors (FETs), designations of source and drain are often interchangeable. Therefore, descriptions of some illustrative embodiments of the source and drain regions provided herein are applicable to embodiments where the designation of source and drain regions may be reversed. Unless explained otherwise, in some settings, the terms S/D region, S/D contact, and S/D terminal of a transistor may be used interchangeably, although, in general, the term "S/D contact" is used to refer to an electrically conductive structure for making a contact to a S/D region of a transistor, while the term "S/D terminal" may generally refer to either S/D region or S/D contact of a transistor.

A term "interconnect" may be used to describe any element formed of an electrically conductive material for providing electrical connectivity to one or more components associated with an IC or/and between various such components. In general, the term "interconnect" may refer to both conductive lines (or, simply, "lines," also sometimes referred to as "traces" or "trenches") and conductive vias (or, simply, "vias"). In general, in context of interconnects, the term "conductive line" may be used to describe an electrically conductive element isolated by an insulator material (e.g., a low-k dielectric material) that is provided within the plane of an IC die. Such lines are typically stacked into several levels, or several layers, of a metallization stack. On the other hand, the term "via" may be used to describe an electrically conductive element that interconnects two or more lines of different levels. To that end, a via may be provided substantially perpendicularly to the plane of an IC die and may interconnect two lines in adjacent levels or two lines in not adjacent levels. A term "metallization stack" may be used to refer to a stack of one or more interconnects for providing connectivity to different circuit components of an IC chip. Sometimes, lines and vias may be referred to as "metal traces" and "metal vias", respectively, to highlight the fact that these elements include electrically conductive materials such as metals.

Still further, the terms "package" and "IC package" are synonymous, as are the terms "die" and "IC die," the term "insulating" means "electrically insulating," the term "conducting" means "electrically conducting," unless otherwise specified. Although certain elements may be referred to in the singular herein, such elements may include multiple sub-elements. For example, "an electrically conductive material" may include one or more electrically conductive materials. If used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide. The terms "substantially," "close," "approximately," "near," and "about," generally refer to being within +/−20% of a target value (e.g., within +/−10% or within +/−5% of a target value) based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 4A-4C, such a collection may be referred to herein without the letters, e.g., as "FIG. 4." In order to not clutter the drawings, sometimes only one instance of a given element is labeled in a drawing with a reference numeral, although other similar elements may be shown.

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Furthermore, although a certain number of a given element may be illustrated in some of the drawings (e.g., a certain number and type of memory layers, a certain number and type of transistors of memory cells, or a certain arrangement of interconnects), this is simply for ease of illustration, and more, or less, than that number may be included in the IC devices and related assemblies and packages according to various embodiments of the present disclosure. Still further, various views shown in some of the drawings are intended to show relative arrangements of various elements therein. In other embodiments, various IC devices and related assemblies and packages, or portions thereof, may include other elements or components that are not illustrated (e.g., transistor portions, various further components that may be in electrical contact with any of the illustrated components of the IC devices and related assemblies and packages, etc.). Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., physical failure analysis (PFA) would allow determination of presence of one or more IC devices implementing 2T capacitorless memory cells with stacked TFTs as described herein.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC devices implementing 2T capacitorless memory cells with stacked TFTs as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Figure 7:
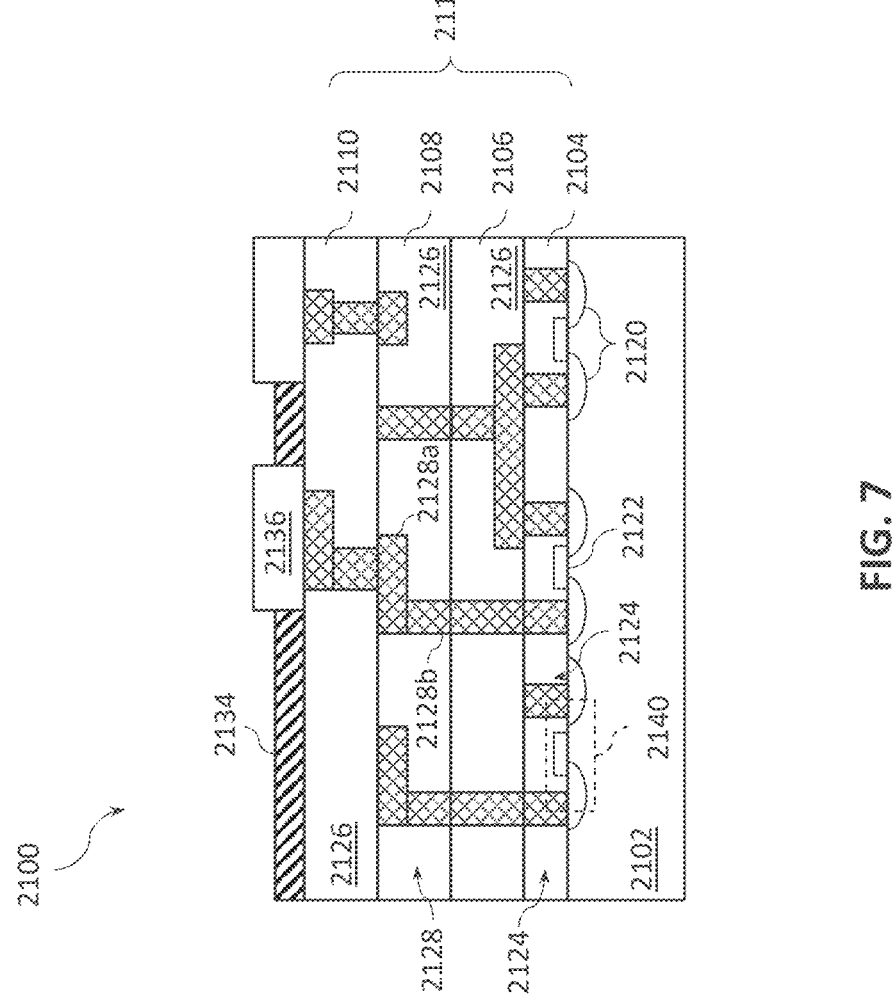
FIG. 7 is a cross-sectional side view of an IC device that may include one or more memory arrays implementing 2T capacitorless memory cells with stacked TFTs in accordance with any of the embodiments disclosed herein.

FIG. 1 provides a schematic illustration of a cross-sectional view of an example IC device (e.g., a chip) 100 in which 2T capacitorless memory cells with stacked TFTs may be implemented, according to some embodiments of the present disclosure. As shown in FIG. 1, the IC device may include a support structure 102, a first transistor layer 104, and a second transistor layer 104. In general, the support structure 102 may include any of the materials described below with reference to the substrate 2102 (FIG. 7). The first transistor layer 104 may be a layer in which first transistors (e.g., write transistors) of 2T capacitorless memory cells as described herein may be implemented, while the second transistor layer 106 may be a layer in which second transistors (e.g., read transistors) of 2T capacitorless memory cells as described herein may be implemented. The second transistor layer 106 may be stacked above the first transistor layer 104 (i.e., the first transistor layer 104 may be between the support structure and the second transistor layer 106), meaning that the 2T capacitorless memory cells as described herein may include stacked transistors. In some embodiments, some or all of the transistors of the first transistor layer 104 may be TFTs, while some or all of the transistors of the second transistor layer 106 may be transistors with single-crystalline semiconductor channel materials implemented by layer transfer. In some embodiments, the transistors of both the first and the second transistor layers 104, 106 may be TFTs.

In some embodiments, the IC device 100 may also include a FEOL layer 103 between the first transistor layer 104 and the support structure 102, as also shown in FIG. 1, although in other embodiments of the IC device 100 the FEOL layer 103 may be excluded. The FEOL layer 103 may include various frontend/FEOL devices, e.g., frontend transistors. In some embodiments, the frontend transistors implemented in the FEOL layer 103 may be a part of compute logic, e.g., to serve as a memory peripheral circuit for the memory arrays of 2T memory cells provided in the first and second transistor layers 104, 106. For example, the frontend transistors of the FEOL layer 103 may be responsible for compute logic functionality related to read/write operations with respect to the data stored in the 2T memory cells provided in the first and second transistor layers 104, 106. To that end, some of the frontend transistors of the FEOL layer 103 may be part of one or more input/output (I/O) ICs (e.g., a memory peripheral circuit) configured to control (e.g., control access (read/write), store, refresh) the memory cells implemented in the IC device 100 (e.g., the 2T memory cells provided in the first and second transistor layers 104, 106). In some embodiments, some of the frontend transistors of the FEOL layer 103 may be part of high-performance compute logic, configured to perform various operations with respect to data stored in the 2T memory cells provided in the first and second transistor layers 104, 106 of the IC device 100 (e.g., arithmetic and logic operations, pipelining of data from one or more of the memory arrays implemented in the IC device 100, and possibly also data from external devices/chips).

In some embodiments, the first and second transistor layer 104, 106 may be provided, or be a part of, a BEOL layer of the IC device 100.

Various ones of the FEOL layer 103, and the first and second transistor layer 104, 106 may be, or may include, metal layers of the IC device 100. Generally speaking, each of the metal layers of the IC device 100 may include a via portion and a trench/interconnect portion. The trench portion of a metal layer is configured for transferring signals and power along electrically conductive (e.g., metal) lines (also sometimes referred to as "trenches") extending in the x-y plane (e.g., in the x or y directions), while the via portion of a metal layer is configured for transferring signals and power through electrically conductive vias extending in the z-direction, e.g., to any of the adjacent metal layers above or below. Accordingly, vias connect metal structures (e.g., metal lines or vias) from one metal layer to metal structures of another (e.g., an adjacent) metal layer. While referred to as "metal" layers, various layers of the IC device 100 may include only certain patterns of conductive metals, e.g., copper (Cu), aluminum (Al), tungsten (W), or cobalt (Co), or metal alloys, or more generally, patterns of an electrically conductive material, formed in an insulating medium such as an interlayer dielectric (ILD) material. The insulating medium may include any suitable ILD materials such as silicon oxide, carbon-doped silicon oxide, silicon carbide, silicon nitride, aluminum oxide, and/or silicon oxynitride.

FIG. 2 is an electric circuit diagram of a 2T capacitorless memory cell 200 that may be implemented as one of the memory cells of a memory array of the IC device 100 of FIG. 1, according to some embodiments of the present disclosure. As shown in FIG. 2, the memory cell 200 may include a first transistor 210 and a second transistor 220. Each of the first transistor 210 and the second transistor 220 may include a first S/D terminal, a second S/D terminal, and a gate terminal, where the different S/D terminal are labeled in FIG. 2 as "S" to designate a source terminal and "D" to designate a drain terminal, and where a label "G" is used in FIG. 2 to designate the gate terminals of the transistors 210, 220.

As shown in FIG. 2, one of the S/D terminals of the first transistor 210 (e.g., a drain terminal, as shown in FIG. 2, although in other embodiments this may be a source terminal) may be coupled to the gate terminal of the second transistor 220, the other one of the S/D terminals of the first transistor 210 (e.g., a source terminal, as shown in FIG. 2, although in other embodiments this may be a drain terminal) may be coupled to a WBL 212, and the gate terminal of the first transistor 210 may be coupled to a WWL 214. As further shown in FIG. 2, one of the S/D terminals of the second transistor 220 (e.g., a source terminal, as shown in FIG. 2, although in other embodiments this may be a drain terminal) may be coupled to a RBL 222, the other one of the S/D terminals of the second transistor 220 (e.g., a drain terminal, as shown in FIG. 2, although in other embodiments this may be a source terminal) may be coupled to a WWL 224, and the gate terminal of the second transistor 220 may be coupled to one of the S/D terminals of the first transistor 210 (e.g., a drain terminal, as shown in FIG. 2, although in other embodiments this may be a source terminal). A memory state, or a bit value (i.e., logical "1" or "0") of the memory cell 200 may be represented by charge indicative of the bit value, stored in a storage node (SN) 230 between (i.e., coupled to) the gate terminal of the second transistor 220 and the S/D terminal of the first transistor 210 to which the gate terminal of the second transistor 220 is coupled to. The SN 230 may be implemented, e.g., as an interconnect that couples the gate terminal of the second transistor 220 and one of the S/D terminals of the first transistor 210. In particular, the memory cell 200 may not include a deliberately included separate capacitor to store such charge. For example, the memory cell 200 may be configured to store charge indicative of a bit value as a parasitic capacitance of the SN 230, but not include a deliberately added capacitor coupled to the gate terminal of the second transistor 220 and the S/D terminal of the first transistor 210 to which the gate terminal of the second transistor 220 is coupled to. Such a deliberately added capacitor could, e.g., be implemented as a metal-insulator-metal capacitor, e.g., as a cylindrical capacitor, and have a capacitance of at least about 1-20 femtofarad, e.g., a capacitance of at least about 10 femtofarad.

The first transistor 210 may be a write transistor, used for programming a bit value in the memory cell 200 (i.e., writing a bit value to the memory cell 200 by storing the charge indicative of the bit value in the storage node 230). The second transistor 220 may be a read transistor, used for reading the memory cell 200 (i.e., determining the bit value that was stored in the memory cell 200 by sensing the charge stored in the storage node 230). In some embodiments, the first transistor 210 may be implemented in the first transistor layer 104 of the IC device 100, while the second transistor 220 may be implemented in the second transistor layer 106 of the IC device 100. In some embodiments, a plurality of the memory cells 200 may be implemented in the IC device 100, e.g., with all first transistors 210 of different memory cells 200 being implemented in the first transistor layer 104 of the IC device 100, and with all second transistors 220 of different memory cells 200 being implemented in the second transistor layer 106 of the IC device 100.

In some embodiments, both the first transistor 210 and the second transistor 220 may be implemented as TFTs. In other embodiments, the first transistor 210 may be implemented as a TFT while the second transistor 220 may be implemented as a transistor with a substantially single-crystalline semiconductor channel material, or vice versa. Thus, the memory cell 200 may be referred to as a memory cell with a stacked TFT because either the bottom transistor, or the top transistor, or both the top and at the bottom transistor of the three-dimensional (3D) arrangement of the memory cell 200 is a TFT.

Figure 3:
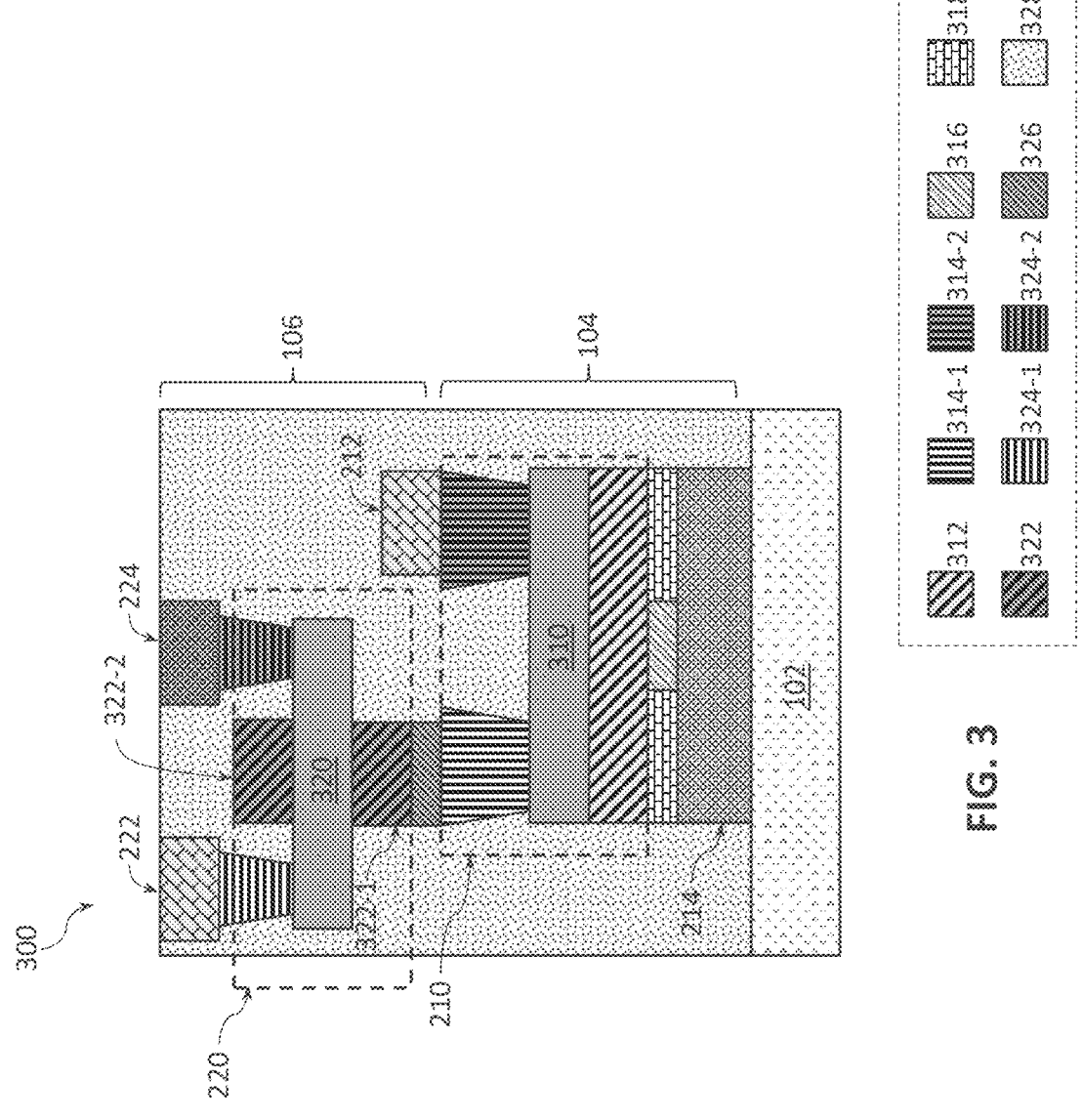
FIG. 3 is a cross-sectional side view of an example IC device with a 2T capacitorless memory cell with a stacked TFT, according to some embodiments of the present disclosure.

FIG. 3 is a cross-sectional side view of an example IC device 300 with a 2T capacitorless memory cell with a stacked TFT, according to some embodiments of the present disclosure. The IC device 300 may be an example of the IC device 100, shown in FIG. 1, and a 2T memory cell of the IC device 300 may be an example of the memory cell 200, shown in FIG. 2. To that end, FIG. 3 includes reference numerals of the various portions of the IC device 100 and the memory cell 200, as described above. A number of elements labeled in FIG. 3, as well as in FIG. 4, with reference numerals are illustrated in these figures with different patterns, with a legend showing the correspondence between the reference numerals and patterns being provided at the bottom of these figures. For example, the legend illustrates that FIG. 3 uses different patterns to show a gate stack 312, a first S/D contact 314-1, a second S/D contact 314-2, etc.

As shown in FIG. 3, the first transistor 210 may be implemented in the first transistor layer 104 and may include a channel layer 310, a gate stack 312, a first S/D contact (which may also be referred to as a "first S/D electrode") 314-1, and a second S/D contact (which may also be referred to as a "second S/D electrode") 314-2. In some embodiments, the first transistor 210 may be a TFT. In such embodiments, the channel layer 310 may be composed of semiconductor material systems including, for example, N-type or P-type materials systems. In some embodiments, the channel layer 310 may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the channel layer 310 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In particular, the channel layer 310 may be formed of a thin-film material. Some such materials may be deposited at relatively low temperatures, which allows depositing them within the thermal budgets imposed on back end fabrication to avoid damaging the front end components such as the logic devices of the FEOL layer 103 of the IC device 100. In some embodiments, the channel layer 310 may have a thickness between about 5 and 75 nanometers, including all values and ranges therein.

The first and second S/D contacts 314 may include any suitable electrically conductive material, alloy, or a stack of multiple electrically conductive materials. In some embodiments, the S/D contacts 314 of the first transistor 210 may include one or more metals or metal alloys, with metals e.g., copper, ruthenium, palladium, platinum, cobalt, nickel, hafnium, zirconium, titanium, tantalum, and aluminum, tantalum nitride, tungsten, doped silicon, doped germanium, or alloys and mixtures of these. In some embodiments, the S/D contacts 314 may include one or more electrically conductive alloys, oxides, or carbides of one or more metals. In some embodiments, the S/D contacts 314 may include a doped semiconductor, such as silicon or another semiconductor doped with an N-type dopant or a P-type dopant. Metals may provide higher conductivity, while doped semiconductors may be easier to pattern during fabrication. In some embodiments, the S/D contacts 314 may have a thickness (i.e., dimension measured in a direction perpendicular to the support structure 102) between about 2 nanometers and 1000 nanometers, preferably between about 2 nanometers and 100 nanometers.

In some embodiments, the first and second S/D contacts 314 may be coupled to (e.g., be in contact with) respective first and second S/D regions of the first transistor 210. Such first and second S/D regions may be provided in the channel layer 310, on either side of the gate stack 310. As is known in the art, S/D regions of a transistor (also sometimes interchangeably referred to as "diffusion regions") are regions of doped semiconductors, e.g., regions of a doped channel material, so as to supply charge carriers for the transistor channel. Often, the S/D regions are highly doped, e.g., with dopant concentrations of about $1 \cdot 10^{21}$ dopant atoms per cubic centimeter ($cm^{-3}$), in order to advantageously form Ohmic contacts with the respective S/D contacts/electrodes, although these regions may also have lower dopant concentrations and may form Schottky contacts in some implementations. Irrespective of the exact doping levels, the S/D regions of a transistor are the regions having dopant concentration higher than in other regions, e.g., higher than a dopant concentration in the transistor channel (i.e., in a channel material extending between the source region and the drain region), and, therefore, may be referred to as "highly doped" (HD) regions. The channel portion of a transistor may include one or more semiconductor materials with doping concentrations significantly smaller than those of the S/D regions. For example, in some embodiments, the channel portion of a transistor may be formed of an intrinsic (i.e., undoped) semiconductor material or alloy, not intentionally doped with any electrically active impurity. In alternate embodiments, one or more a nominal impurity dopant level may be present within the channel material, for example to set a threshold voltage Vt, or to provide HALO pocket implants, etc. In such impurity-doped embodiments however, impurity dopant levels within the channel portion of a transistor are still significantly lower than in the S/D regions, e.g., with impurity dopant concentrations being below $10^{15}$ cm$^{-3}$, or below $10^{13}$ cm$^{-3}$.

S/D regions of a transistor may generally be formed using either an implantation/diffusion process or an etching/deposition process. In the former process, dopants such as boron, aluminum, antimony, phosphorous, or arsenic may be ion-implanted into the channel material to form the S/D regions. An annealing process that activates the dopants and causes them to diffuse further into the channel material typically follows the ion implantation process. In the latter process, the channel material may first be etched to form recesses at the locations of the S/D regions. An epitaxial deposition process may then be carried out to fill the recesses with material that is used to fabricate the S/D regions. In some implementations, the S/D regions may be fabricated using a silicon alloy such as silicon germanium or silicon carbide. In some implementations the epitaxially deposited silicon alloy may be doped in situ with dopants such as boron, arsenic, or phosphorous. In further embodiments, the S/D regions may be formed using one or more alternate semiconductor materials such as germanium or a group III-V material or alloy. And in further embodiments, one or more layers of metal and/or metal alloys may be used to form the S/D regions.

As also shown in FIG. 3, the second transistor 220 may be implemented in the second transistor layer 106 and may include a channel layer 320, a gate stack 322, a first S/D contact (which may also be referred to as a "first S/D electrode") 324-1, and a second S/D contact (which may also be referred to as a "second S/D electrode") 324-2. In some embodiments, the second transistor 220 may be a TFT, in which embodiments the channel layer 320 may include any of the materials described with reference to the channel layer 310. In other embodiments, the second transistor 220 may be a non-TFT. In such embodiments, the channel layer 320 may also be composed of semiconductor material systems including, for example, N-type or P-type materials systems, and may include some of the materials described with reference to the channel layer 310, but those materials of the channel layer 320 may be substantially single-crystalline (or monocrystalline). For example, in some embodiments, the material of the channel layer 320 may include a monocrystalline semiconductor, such as silicon (Si) or germanium (Ge). In some embodiments, the material of the channel layer 320 may include a compound semiconductor with a first sub-lattice of at least one element from group III of the periodic table (e.g., Al, Ga, In), and a second sub-lattice of at least one element of group V of the periodic table (e.g., P, As, Sb).

For some example N-type transistor embodiments (i.e., for the embodiments where the second transistor 220 is an N-type metal-oxide-semiconductor (NMOS) transistor), the channel portion of the channel layer 320 may advantageously include a III-V material having a high electron mobility, such as, but not limited to InGaAs, InP, InSb, and InAs. For some such embodiments, the channel portion may be a ternary III-V alloy, such as InGaAs, GaAsSb, InAsP, or InPSb. For some In$_x$Ga$_{1-x}$As fin embodiments, In content (x) may be between 0.6 and 0.9, and may advantageously be at least 0.7 (e.g., In$_{0.7}$Ga$_{0.3}$As). In some embodiments with highest mobility, the channel portion may be an intrinsic III-V material, i.e., a III-V semiconductor material not intentionally doped with any electrically active impurity. In alternate embodiments, a nominal impurity dopant level may be present within the channel portion, for example to further fine-tune a threshold voltage Vt, or to provide HALO pocket implants, etc. Even for impurity-doped embodiments however, impurity dopant level within the channel portion of the channel layer 320 may be relatively low, for example below $10^{15}$ cm$^{-3}$, and advantageously below $10^{13}$ cm$^{-3}$.

For some example P-type transistor embodiments (i.e., for the embodiments where the second transistor 220 is a P-type metal-oxide-semiconductor (PMOS) transistor), the channel portion of the channel layer 320 may advantageously be a group IV material having a high hole mobility, such as, but not limited to Ge or a Ge-rich SiGe alloy. For some example embodiments, the channel portion may have a Ge content between 0.6 and 0.9, and advantageously may be at least 0.7. In some embodiments with highest mobility, the channel portion may be intrinsic III-V (or IV for P-type devices) material and not intentionally doped with any electrically active impurity. In alternate embodiments, one or more a nominal impurity dopant level may be present within the channel portion of the channel layer 320, for example to further set a threshold voltage (Vt), or to provide HALO pocket implants, etc. Even for impurity-doped embodiments however, impurity dopant level within the channel portion is relatively low, for example below $10^{15}$ cm$^{-3}$, and advantageously below $10^{13}$ cm$^{-3}$.

The first and second S/D contacts 324 may include any suitable electrically conductive material, alloy, or a stack of multiple electrically conductive materials, e.g., any of those described with reference to the first and second S/D contacts 314. In some embodiments, the first and second S/D contacts 324 may be coupled to (e.g., be in contact with) respective first and second S/D regions of the second transistor 220, which may be similar to the first and second S/D regions of the first transistor 210, described above.

As shown in FIG. 3, in some embodiments, the first transistor 210 may be arranged so that the gate stack 312 is between the channel layer 310 and the WWL 214, and the WWL 214 may be closer to the support structure 102 than the channel layer 310. Thus, the first transistor 210 may be referred to as a "bottom-gated transistor" because the gate stack 312 is provided at the bottom of the channel layer 310 (i.e., closer to the support structure 102). In some embodiments, the gate stack 312 may be separated from the WWL 214 by a layer of an insulator material 318, e.g., an etch-stop material such as SiN, except for an interconnect 316 (e.g., a conductive via) that may couple the gate stack 312 to the WWL 214. In such embodiments, a first end of the interconnect 316 may be coupled to (e.g., be in contact with) the WWL 214, while a second end of the interconnect 316, the second end being opposite the first end, may be coupled to (e.g., be in contact with) the gate stack 312.

In some embodiments, both S/D contacts 314 may be provided at the top of the channel layer 310, i.e., be coupled to (e.g., be in contact with) the top face of the channel layer 310, which is opposite the bottom face of the channel layer 310 to which the gate stack 312 is coupled to. As shown in FIG. 3, the first S/D contact 314-1 may be coupled to a first gate stack 322-1 of the second transistor 220, e.g., via an interconnect 326 (e.g., a conductive via). In such embodiments, a first end of the interconnect 326 may be coupled to (e.g., be in contact with) the first S/D contact 314-1, while a second end of the interconnect 326, the second end being opposite the first end, may be coupled to (e.g., be in contact with) the first gate stack 322-1 of the second transistor 220. As also shown in FIG. 3, the second S/D contact 314 may be coupled to (e.g., be in contact with) the WBL 212.

Turning to the second transistor 220, as shown in FIG. 3, in some embodiments, the second transistor 220 may be arranged so that the first gate stack 322-1 is between the channel layer 320 and the channel layer 310 of the first transistor 310, and the channel layer 310 is closer to the support structure 102 than the channel layer 320. The first gate stack 322-1 is coupled to the first S/D contacts 314-1, as described above. The second transistor 220 may further include a second gate stack 322-2, on the opposite face of the channel later 320 than the first gate stack 322-1, where the second gate stack 322-2 may be coupled to a voltage source so that voltage may be applied to the second gate stack 322-2 to advantageously change the threshold voltage of the second transistor 220. Thus, the second transistor 220 may be referred to as a "dual-gated transistor" because it may include two gates 322.

As also shown in FIG. 3, the first S/D contact 324-1 may be coupled to (e.g., be in contact with) the RBL 222, while the second S/D contact 324-2 may be coupled to (e.g., be in contact with) the RWL 224.

FIG. 3 further illustrates an ILD material 328 that may surround various portions of the memory cells 200 implemented in the IC device 300. In various embodiments, the ILD material 328 may include any suitable ILD materials such as silicon oxide, carbon-doped silicon oxide, silicon carbide, silicon nitride, aluminum oxide, and/or silicon oxynitride. In various embodiments, the ILD material 328 may include a low-k dielectric material. Examples of the low-k dielectric materials that may be used as the ILD material 328 include, but are not limited to, silicon dioxide, carbon-doped oxide, silicon nitride, fused silica glass (FSG), and organosilicates such as silsesquioxane, siloxane, and organosilicate glass. Other examples of low-k dielectric materials that may be used as the ILD material 328 include organic polymers such as polyimide, polynorbornenes, benzocyclobutene, perfluorocyclobutane, or polytetrafluoroethylene (PTFE). Still other examples of low-k dielectric materials that may be used as the ILD material 328 include silicon-based polymeric dielectrics such as hydrogen silsesquioxane (HSQ) and methylsilsesquioxane (MSQ). Other examples of low-k materials that may be used in the ILD material 328 include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1. In various embodiments, various interconnects included in the IC device 300 may include any suitable electrically conductive material, alloy, or a stack of multiple electrically conductive materials. In some embodiments, various electrically conductive materials described herein may include one or more metals or metal alloys, with metals such as copper, ruthenium, palladium, platinum, cobalt, nickel, hafnium, zirconium, titanium, tantalum, molybdenum, tungsten and aluminum. In some embodiments, various electrically conductive materials described herein may include one or more electrically conductive alloys, oxides (e.g., conductive metal oxides), carbides (e.g., hafnium carbide, zirconium carbide, titanium carbide, tantalum carbide, and aluminum carbide), or nitrides (e.g., hafnium nitride, zirconium nitride, titanium nitride, tantalum nitride, and aluminum nitride) of one or more metals.

Figures 4A, 4B, 4C:
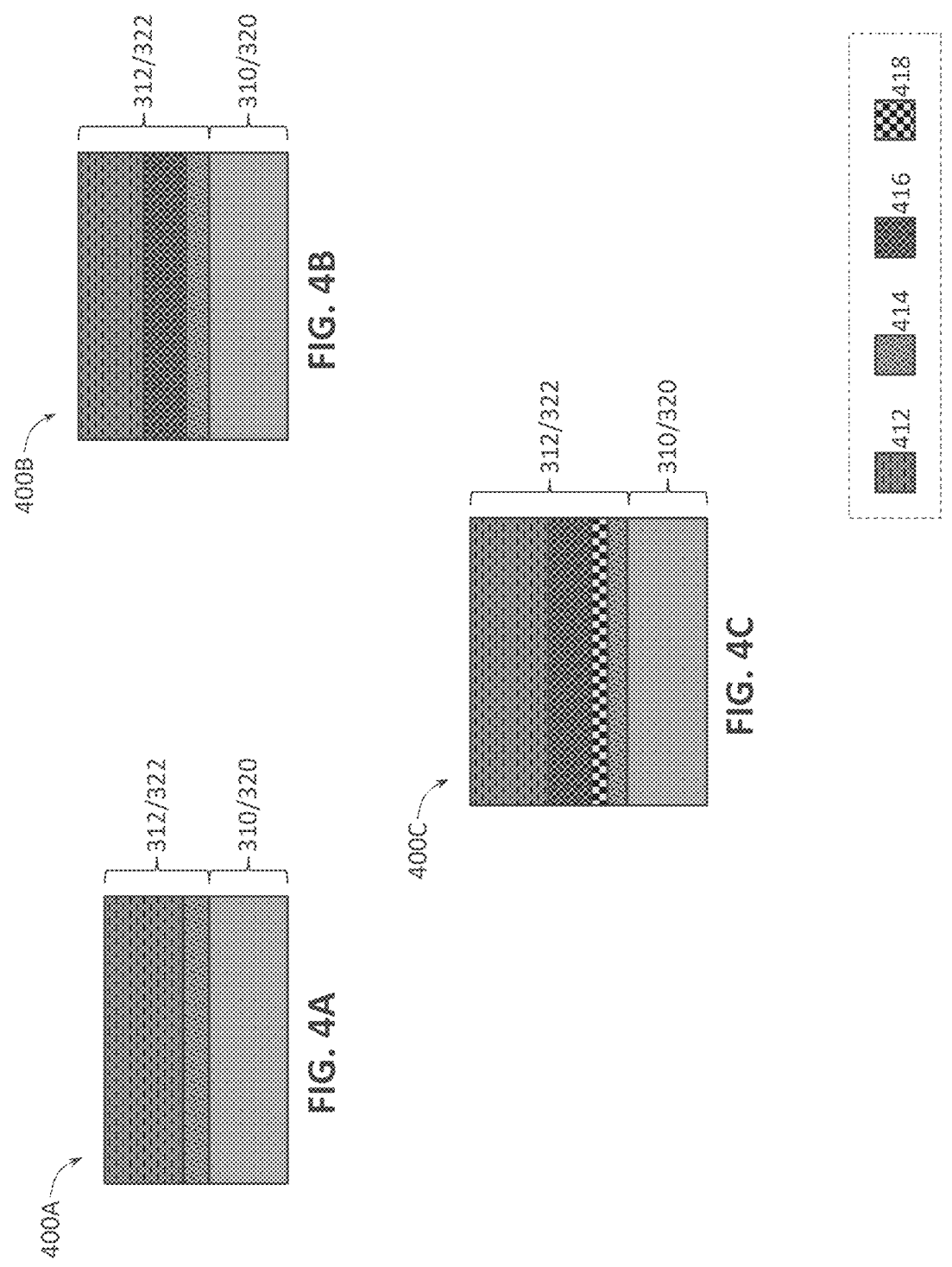
FIGS. 4A-4C are cross-sectional side views of gate stacks for a 2T capacitorless memory cell with a stacked TFT, according to some embodiments of the present disclosure.

In various embodiments, any of the gate stacks 312, 322 may be implemented in different manners. FIGS. 4A-4C are cross-sectional side views of gate stacks 400 for a 2T capacitorless memory cell with a stacked TFT, according to different embodiments of the present disclosure. Any of the gate stacks 400 shown in FIGS. 4A-4C may be used to implement any of the gate stack 312, the first gate stack 322-1, and the second gate stack 322-2, as described herein.

A gate stack 400A, shown in FIG. 4A, illustrates an embodiment where any of the gate stacks 312/322 may include a stack of a gate electrode material 412 and a gate dielectric material 414, where the gate dielectric material 414 is between the gate electrode material 412 and the corresponding channel layer 310/320. In some such embodiments, one side of the gate dielectric material 414 may be in contact with the channel layer 310/320 while the opposite side of the gate dielectric material 414 may be in contact with the gate electrode material 412.

The gate electrode material 412 may include at least one P-type work function metal or N-type work function metal, depending on whether the transistor 210, 220 in which this gate electrode material 412 is implemented is a PMOS transistor or an NMOS transistor. For a PMOS transistor, metals that may be used for the gate electrode material 412 may include, but are not limited to, ruthenium, palladium, platinum, cobalt, nickel, and conductive metal oxides (e.g., ruthenium oxide). For an NMOS transistor, metals that may be used for the gate electrode material 412 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode material 412 may include a stack of two or more metal layers, where one or more metal layers are work function metal layers and at least one metal layer is a fill metal layer. Further metal layers may be included for other purposes, such as to act as a diffusion barrier layer.

The gate dielectric material 414 may laterally surround the channel layer 310/320, and the gate electrode material 412 may laterally surround the gate dielectric material 414 such that the gate dielectric material 414 is disposed between the gate electrode material 412 and the channel layer 310/320. In various embodiments, the gate dielectric material 414 may include one or more high-k dielectric materials and may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric material 414 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric material 414 during manufacture of the transistors 210, 220 to improve the quality of the gate dielectric material 414. In some embodiments, the gate dielectric material 414 may have a thickness between about 0.5 nanometers and 3 nanometers, including all values and ranges therein, e.g., between about 1 and 3 nanometers, or between about 1 and 2 nanometers.

In some embodiments, the gate dielectric material 414 may be a multilayer gate dielectric, e.g., it may include any of the high-k dielectric materials in one layer and a layer of IGZO. In some embodiments, the gate stack (i.e., a combination of the gate dielectric material 414 and the gate electrode material 412) may be arranged so that the IGZO is disposed between the high-k dielectric and the channel layer 310/320. In such embodiments, the IGZO may be in contact with the channel layer 310/320, and may provide the interface between the channel layer 310/320 and the remainder of the multilayer gate dielectric material 414. The IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10).

A gate stack 400B, shown in FIG. 4B, illustrates an embodiment where any of the gate stacks 312/322 may include a stack of the gate electrode material 412, a ferroelectric (FE) or an antiferroelectric (AFE) material 416, and the gate dielectric material 414. In such embodiments, the gate dielectric material 414 is still between the gate electrode material 412 and the corresponding channel layer 310/320, as in the gate stack 400A. More specifically, the gate dielectric material 414 may be between the FE/AFE material 416 and the corresponding channel layer 310/320, and the FE/AFE material 416 may be between the gate dielectric material 414 and the gate electrode material 412. In some such embodiments, one side of the gate dielectric material 414 may be in contact with the channel layer 310/320 while the opposite side of the gate dielectric material 414 may be in contact with the FE/AFE material 416. Similarly, one side of the FE/AFE material 416 may be in contact with the gate dielectric material 414 and the opposite side of the FE/AFE material 416 may be in contact with the gate electrode material 412.

As used herein, a FE or an AFE material is a material that exhibits, over some range of temperatures, spontaneous electric polarization, i.e., displacement of positive and negative charges from their original position, where the polarization can be reversed or reoriented by application of an electric field. In particular, an AFE material is a material that can assume a state in which electric dipoles from the ions and electrons in the material may form a substantially ordered (e.g., substantially crystalline) array, with adjacent dipoles being oriented in opposite (antiparallel) directions (i.e., the dipoles of each orientation may form interpenetrating sub-lattices, loosely analogous to a checkerboard pattern), while a FE material is a material that can assume a state in which all of the dipoles point in the same direction. Because the displacement of the charges in FE and AFE materials can be maintained for some time even in the absence of an electric field, such materials may be used to implement memory cells. The term "ferroelectric" is said to be adopted to convey the similarity of FE memories to ferromagnetic memories, despite the fact that there is typically no iron (Fe) present in FE materials. The term "FE transistor" may be used to refer to a transistor employing FE or AFE materials, e.g., in a gate stack as shown in FIG. 4B. Memory cells with FE transistors have the potential for adequate non-volatility, short programming time, low power consumption, high endurance, and high speed writing. In addition, FE transistors advantageously have the potential to be manufactured using processes compatible with the standard CMOS technology.

The FE/AFE material 416 may be provided between the gate electrode material 412 and the channel layer 310/320. The FE/AFE material 416 may include one or more materials which exhibit sufficient FE or AFE behavior even at thin dimensions as typically used in scaled transistors as the ones illustrated here. In some embodiments, the FE/AFE material 416 may include a material including hafnium, zirconium, and oxygen (e.g., hafnium zirconium oxide (HZO)), possibly doped with one or more dopants such as silicon, germanium, aluminum, yttrium, lanthanum, gadolinium, or niobium. In some embodiments, the FE/AFE material 416 may include a material including hafnium and oxygen (e.g., hafnium oxide), doped with one or more dopants. For example, the FE/AFE material 416 may include one or more of a material including silicon, hafnium, and oxygen (e.g., silicon-doped hafnium oxide), a material including germanium, hafnium, and oxygen (e.g., germanium-doped hafnium oxide), a material including aluminum, hafnium, and oxygen (e.g., aluminum-doped hafnium oxide), a material including yttrium, hafnium, and oxygen (e.g., yttrium-doped hafnium oxide), a material including lanthanum, hafnium, and oxygen (e.g., lanthanum-doped hafnium oxide), a material including gadolinium, hafnium, and oxygen (e.g., gadolinium-doped hafnium oxide), and a material including niobium, hafnium, and oxygen (e.g., niobium-doped hafnium oxide). However, in other embodiments, any other materials which exhibit FE or AFE behavior at thin dimensions may be used as the FE/AFE material 416 and are within the scope of the present disclosure. A layer of the FE/AFE material 416 may be a thin-film material and may have a thickness between about 0.5 nanometers and 15 nanometers, including all values and ranges therein (e.g., between about 1 and 10 nanometers, or between about 0.5 and 5 nanometers).

A gate stack 400C, shown in FIG. 4C, illustrates an embodiment where any of the gate stacks 312/322 may include a stack of the gate electrode material 412, the FE/AFE material 416, an intermediate material 418, and the gate dielectric material 414. In such embodiments, the gate dielectric material 414 is still between the gate electrode material 412 and the corresponding channel layer 310/320, as in the gate stacks 400A and 400B. More specifically, the gate dielectric material 414 may be between the intermediate material 418 and the corresponding channel layer 310/320, the intermediate material 418 may be between the gate dielectric material 414 and the FE/AFE material 416, and the FE/AFE material 416 may be between the intermediate material 418 and the gate electrode material 412. In some such embodiments, one side of the gate dielectric material 414 may be in contact with the channel layer 310/320 while the opposite side of the gate dielectric material 414 may be in contact with the intermediate material 418. Similarly, one side of the intermediate material 418 may be in contact with the gate dielectric material 414 and the opposite side of the intermediate material 418 may be in contact with the FE/AFE material 416. Furthermore, one side of the FE/AFE material 416 may be in contact with the intermediate material 418 and the opposite side of the FE/AFE material 416 may be in contact with the gate electrode material 412.

IC devices implementing 2T capacitorless memory cells with stacked TFTs, as described herein, may be fabricated using any suitable techniques, e.g., subtractive, additive, damascene, dual damascene, etc. Some of such technique may include suitable deposition and patterning techniques. As used herein, "patterning" may refer to forming a pattern in one or more materials using any suitable techniques (e.g., applying a resist, patterning the resist using lithography, and then etching the one or more material using dry etching, wet etching, or any appropriate technique).

FIG. 5 is a flow diagram of a method 500 of manufacturing an IC device implementing 2T capacitorless memory cells with stacked TFTs (e.g., any of the IC devices 100/300, described herein), according to some embodiments of the present disclosure. The example fabrication method shown in FIG. 5 may include other operations not specifically shown in FIG. 5, such as various cleaning or planarization operations as known in the art. For example, in some embodiments, any of the layers of the IC device, or any of individual IC structures provided within the IC device, may be cleaned prior to, after, or during any of the processes of the fabrication method described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the top surfaces of the IC devices described herein may be planarized prior to, after, or during any of the processes of the fabrication method described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

As shown in FIG. 5, the fabrication method 500 may include a process 502, that includes providing a WWL over a support structure. The WWL provided in the process 502 may include any embodiments of the WWL 214, described herein, and the support structure used in the process 502 may include any embodiments of the support structure 102, described herein. The method 500 may further include a process 504, that includes forming a first transistor over the WWL provided in the process 502 so that a gate stack of the first transistor is coupled to the WWL. The first transistor fabricated in the process 504 may include any embodiments of the first transistor 210, described herein. The method 500 may also include a process 506, that includes providing a WBL over the first transistor provided in the process 504. In particular, the process 506 may include providing the WBL in a layer above the support structure of the process 502, so that a channel material of the first transistor, provided in the process 504, is in a layer that is between the layer with the WBL and the support structure, and so that the WBL is coupled to one of a source region and a drain region of the first transistor. The WBL provided in the process 506 may include any embodiments of the WBL 212, described herein, and may be coupled to one of a source region and a drain region of the first transistor via the second S/D contact 314-2, described herein. The method 500 may also include a process 508, that includes providing a contact over the first transistor provided in the process 504. In particular, the process 508 may include providing the contact in a layer above the support structure of the process 502, so that a channel material of the first transistor, provided in the process 504, is in a layer that is between the layer with the contact and the support structure, and so that the contact is coupled to another one of a source region and a drain region of the first transistor. The contact provided in the process 508 may include any embodiments of the first S/D contact 314-1, described herein. In various embodiments, the processes 506 and 508 may be performed sequentially or in a time-overlapping manner, in any order.

The method 500 may further include a process 510, that includes performing a layer transfer to provide a layer of a substantially single-crystalline semiconductor material over a layer with the contact provided in the process 508 and the WBL provided in the process 506. The layer of the single-crystalline semiconductor material provided in the process 508 may include any embodiments of the second channel layer 320, described herein. The method 500 may also include with a process 512, that includes forming a second transistor over the and coupled to the contact provided in the process 508 so that a gate stack of the second transistor is coupled to the contact provided in the process 508. The second transistor fabricated in the process 512 may include any embodiments of the second transistor 220, described herein.

The method 500 may conclude with a process 514, that includes providing a RBL coupled to one of a source region and a drain region of the second transistor, and also includes providing a RWL coupled to another one of the source region and the drain region of the second transistor. The RBL and RWL provided in the process 514 may include any embodiments of the RBL 222 and the RWL 224, described herein.

Arrangements with 2T capacitorless memory cells with stacked TFTs as disclosed herein may be included in any suitable electronic device. FIGS. 6-10 illustrate various examples of devices and components that may include one or more 2T capacitorless memory cells with stacked TFTs as disclosed herein.

Figures 6A, 6B:
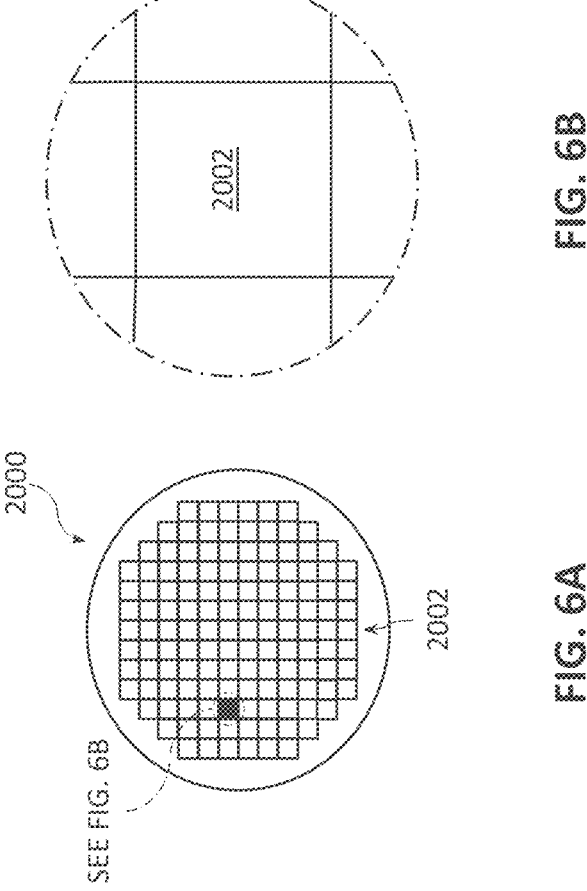
FIGS. 6A-6B are top views of a wafer and dies that may include one or more memory arrays implementing 2T capacitorless memory cells with stacked TFTs in accordance with any of the embodiments disclosed herein.

FIGS. 6A-6B are top views of a wafer 2000 and dies 2002 that may include one or more 2T capacitorless memory cells with stacked TFTs in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 8. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more 2T capacitorless memory cells with stacked TFTs as described herein). After the fabrication of the semiconductor product is complete (e.g., after manufacture of one or more 2T capacitorless memory cells with stacked TFTs as described herein), the wafer 2000 may undergo a singulation process in which each of the dies 2002 is separated from one another to provide discrete "chips" of the semiconductor product. In particular, devices that include one or more 2T capacitorless memory cells with stacked TFTs as disclosed herein may take the form of the wafer 2000 (e.g., not singulated) or the form of the die 2002 (e.g., singulated). The die 2002 may include a plurality of transistors (e.g., one or more write transistors 210 and one or more read transistors 220 as described herein, as well as zero or more FEOL transistors 2140 of FIG. 7, discussed below) and/or supporting circuitry to route electrical signals to the transistors, as well as any other IC components. In some embodiments, the wafer 2000 or the die 2002 may implement or include a memory device (e.g., a SRAM device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 10) or other logic that is configured to store information in the memory devices or execute instructions stored in the memory array.

FIG. 7 is a cross-sectional side view of an IC device 2100 that may include one or more 2T capacitorless memory cells with stacked TFTs in accordance with any of the embodiments disclosed herein. For example, the IC device 2100 may be, or may include, the IC device 100, described above, implementing one or more memory arrays which may include one or more 2T capacitorless memory cells with stacked TFTs according to any embodiments described herein. In particular, different transistors of the one or more 2T capacitorless memory cells with stacked TFTs as described herein may be implemented in any of the BEOL layers of the IC device 2100, e.g., in any of the interconnect layers 2106-2110 shown in FIG. 7. Because there are various possibilities where such 2T capacitorless memory cells with stacked TFTs may be integrated in the IC device 2100, the 2T capacitorless memory cells with stacked TFTs are not specifically shown in FIG. 7. In some embodiments, the IC device 2100 may serve as any of the dies 2256 in the IC package 2300.

As shown in FIG. 7, the IC device 2100 may be formed on a substrate 2102 (e.g., the wafer 2000 of FIG. 6A) and may be included in a die (e.g., the die 2002 of FIG. 6B). The substrate 2102 may include any material that may serve as a foundation for an IC device 2100, or, in general, as a foundation for forming one or more 2T capacitorless memory cells with stacked TFTs according to any embodiments described herein. In some embodiments, the substrate 2102 may be a semiconductor substrate composed of semiconductor material systems including, for example, N-type or P-type material systems. The substrate may include, for example, a crystalline substrate formed using a bulk silicon or a silicon-on-insulator (SOI) structure. In some embodiments, the substrate 2102 may be formed using alternative materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. Further materials classified as group II-VI or group III-V may also be used to form the substrate 2102 on which logic devices, e.g., the FEOL devices 456 as shown in FIG. 4, e.g., the transistors 2140 as shown in FIG. 7, may be formed. In some embodiments, the substrate 2102 may be non-crystalline. In some embodiments, the substrate 2102 may be a printed circuit board (PCB) substrate. Although a few examples of the substrate 2102 are described here, any material or structure that may serve as a foundation upon which an IC device 2100 may be built falls within the spirit and scope of the present disclosure. The substrate 2102 may be part of a singulated die (e.g., the die 2002 of FIG. 6B) or a wafer (e.g., the wafer 2000 of FIG. 6A).

The IC device 2100 may include one or more device layers 2104 disposed on the substrate 2102. The device layer 2104 may include features of one or more transistors 2140 (e.g., metal-oxide-semiconductor field-effect transistors (MOSFETs)) formed on the substrate 2102. The device layer 2104 may include, for example, one or more S/D regions 2120, a gate 2122 to control current flow in the transistors 2140 between the S/D regions 2120, and one or more S/D contacts 2124 to route electrical signals to/from the S/D regions 2120. The transistors 2140 may include additional features not depicted for the sake of clarity, such as device isolation regions, gate contacts, and the like.

Each transistor 2140 may include a gate 2122 formed of at least two layers, a gate dielectric layer and a gate electrode layer. Generally, the gate dielectric layer of a transistor 2140 may include one layer or a stack of layers, and may include any of the materials described above with reference to the gate dielectric material 414. In some embodiments, an annealing process may be carried out on the gate dielectric of the gate 2122 to improve its quality when a high-k material is used.

The gate electrode may be formed on the gate dielectric and may include at least one P-type work function metal or N-type work function metal, depending on whether the transistor 2140 is to be a PMOS or an NMOS transistor. In some implementations, the gate electrode may include a stack of two or more metal layers, where one or more metal layers are work function metal layers and at least one metal layer is a fill metal layer. Further metal layers may be included for other purposes, such as a barrier layer. The gate electrode of the gate 2122 may include any of the materials described above with reference to the gate electrode material 412.

In some embodiments, when viewed as a cross-section of the transistor 2140 along the source-channel-drain direction, the gate electrode of the gate 2122 may include a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may include a combination of U-shaped structures and planar, non-U-shaped structures. For example, the gate electrode may include one or more U-shaped metal layers formed atop one or more planar, non-U-shaped layers. In some embodiments, the gate electrode may include a V-shaped structure (e.g., when the fin of a FinFET does not have a "flat" upper surface, but instead has a rounded peak).

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 2120 may be formed within the substrate 2102, e.g., adjacent to the gate of each transistor 2140. The S/D regions 2120 may be formed using an implantation/diffusion process or an etching/deposition process, for example.

Various transistors 2140 are not limited to the type and configuration depicted in FIG. 7 and may include a wide variety of other types and configurations such as, for example, planar transistors, non-planar transistors (e.g., Fin-FETs, nanowire, or nanoribbon transistors), or a combination of both.

Electrical signals, such as power and/or IO signals, may be routed to and/or from the transistors 2140 of the device layer 2104 through one or more interconnect layers disposed on the device layer 2104 (illustrated in FIG. 7 as interconnect layers 2106-2110). For example, electrically conductive features of the device layer 2104 (e.g., the gate 2122 and the S/D contacts 2124) may be electrically coupled with the interconnect structures 2128 of the interconnect layers 2106-2110. The one or more interconnect layers 2106-2110 may form an ILD stack 2119 of the IC device 2100.

The interconnect structures 2128 may be arranged within the interconnect layers 2106-1210 to route electrical signals according to a wide variety of designs (in particular, the arrangement is not limited to the particular configuration of interconnect structures 2128 depicted in FIG. 7). Although a particular number of interconnect layers 2106-1210 is depicted in FIG. 7, embodiments of the present disclosure include IC devices having more or fewer interconnect layers than depicted.

In some embodiments, the interconnect structures 2128 may include trench structures 2128A (sometimes referred to as "lines") and/or via structures 2128B (sometimes referred to as "holes") filled with an electrically conductive material such as a metal. The trench structures 2128A may be arranged to route electrical signals in a direction of a plane that is substantially parallel with a surface of the substrate 2102 upon which the device layer 2104 is formed. For example, the trench structures 2128A may route electrical signals in a direction in and out of the page from the perspective of FIG. 7. The via structures 2128B may be arranged to route electrical signals in a direction of a plane that is substantially perpendicular to the surface of the substrate 2102 upon which the device layer 2104 is formed. In some embodiments, the via structures 2128B may electrically couple trench structures 2128A of different interconnect layers 2106-2110 together.

The interconnect layers 2106-2110 may include a dielectric material 2126 disposed between the interconnect structures 2128, as shown in FIG. 7. In some embodiments, the dielectric material 2126 disposed between the interconnect structures 2128 in different ones of the interconnect layers 2106-2110 may have different compositions; in other embodiments, the composition of the dielectric material 2126 between different interconnect layers 2106-2110 may be the same. The dielectric material 2126 may include any of the materials described above with reference to the dielectric material 252.

A first interconnect layer 2106 (referred to as Metal 1 or "M1") may be formed directly on the device layer 2104. In some embodiments, the first interconnect layer 2106 may include trench structures 2128A and/or via structures 2128B, as shown. The trench structures 2128A of the first interconnect layer 2106 may be coupled with contacts (e.g., the S/D contacts 2124) of the device layer 2104.

A second interconnect layer 2108 (referred to as Metal 2 or "M2") may be formed directly on the first interconnect layer 2106. In some embodiments, the second interconnect layer 2108 may include via structures 2128B to couple the trench structures 2128A of the second interconnect layer 2108 with the trench structures 2128A of the first interconnect layer 2106. Although the trench structures 2128A and the via structures 2128B are structurally delineated with a line within each interconnect layer (e.g., within the second interconnect layer 2108) for the sake of clarity, the trench structures 2128A and the via structures 2128B may be structurally and/or materially contiguous (e.g., simultaneously filled during a dual damascene process) in some embodiments.

A third interconnect layer 2110 (referred to as Metal 3 or "M3") (and additional interconnect layers, as desired) may be formed in succession on the second interconnect layer 2108 according to similar techniques and configurations described in connection with the second interconnect layer 2108 or the first interconnect layer 2106.

The interconnect layers 2106-2110 may be the metal layers M1-M3, described above and shown in FIG. 1. Although not specifically shown in FIG. 7, further metal layers may be present in the IC device 2100.

The IC device 2100 may include a solder resist material 2134 (e.g., polyimide or similar material) and one or more bond pads 2136 formed above the top interconnect layers of the IC device. The bond pads 2136 may be electrically coupled with the interconnect structures 2128 and configured to route the electrical signals of the transistor(s) 2140 to other external devices. For example, solder bonds may be formed on the one or more bond pads 2136 to mechanically and/or electrically couple a chip including the IC device 2100 with another component (e.g., a circuit board). The IC device 2100 may have other alternative configurations to route the electrical signals from the interconnect layers 2106-2110 than depicted in other embodiments. For example, the bond pads 2136 may be replaced by or may further include other analogous features (e.g., posts) that route the electrical signals to external components.

Figure 8:
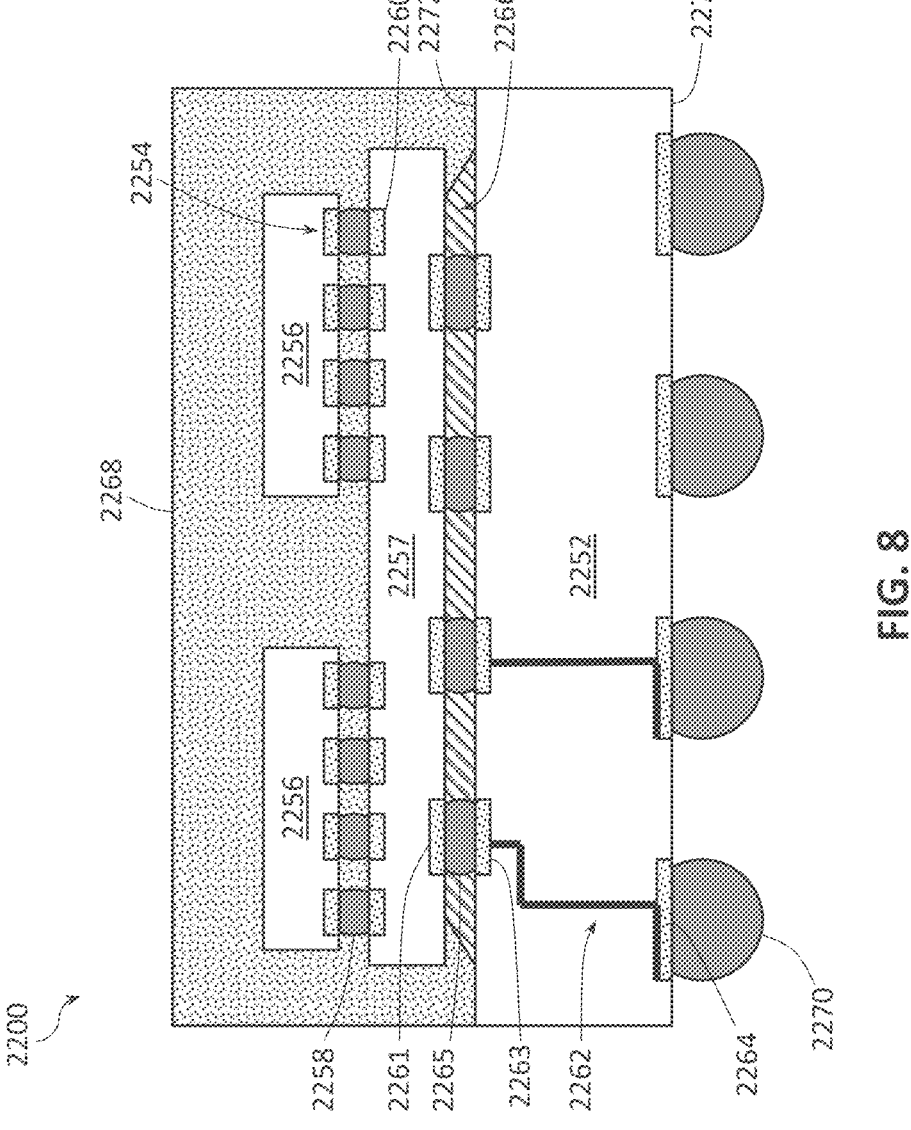
FIG. 8 is a cross-sectional side view of an IC package that may include one or more memory arrays implementing 2T capacitorless memory cells with stacked TFTs in accordance with any of the embodiments disclosed herein.

FIG. 8 is a side, cross-sectional view of an example IC package 2200 that may include one or more 2T capacitorless memory cells with stacked TFTs in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274. These conductive pathways may take the form of any of the interconnect structures 2128 discussed above with reference to FIG. 7.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 8 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 8 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 8 are solder balls (e.g., for a ball grid array arrangement), but any suitable second-level interconnects 2270 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 9.

The dies 2256 may take the form of any of the embodiments of the die 2002 discussed herein (e.g., may include any of the embodiments of the IC device 100 as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory), including dies with the IC devices as described herein. In some embodiments, any of the dies 2256 may include one or more 2T capacitorless memory cells with stacked TFTs, e.g., as discussed above; in some embodiments, at least some of the dies 2256 may not include any 2T capacitorless memory cells with stacked TFTs.

The IC package 2200 illustrated in FIG. 8 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 8, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 9:
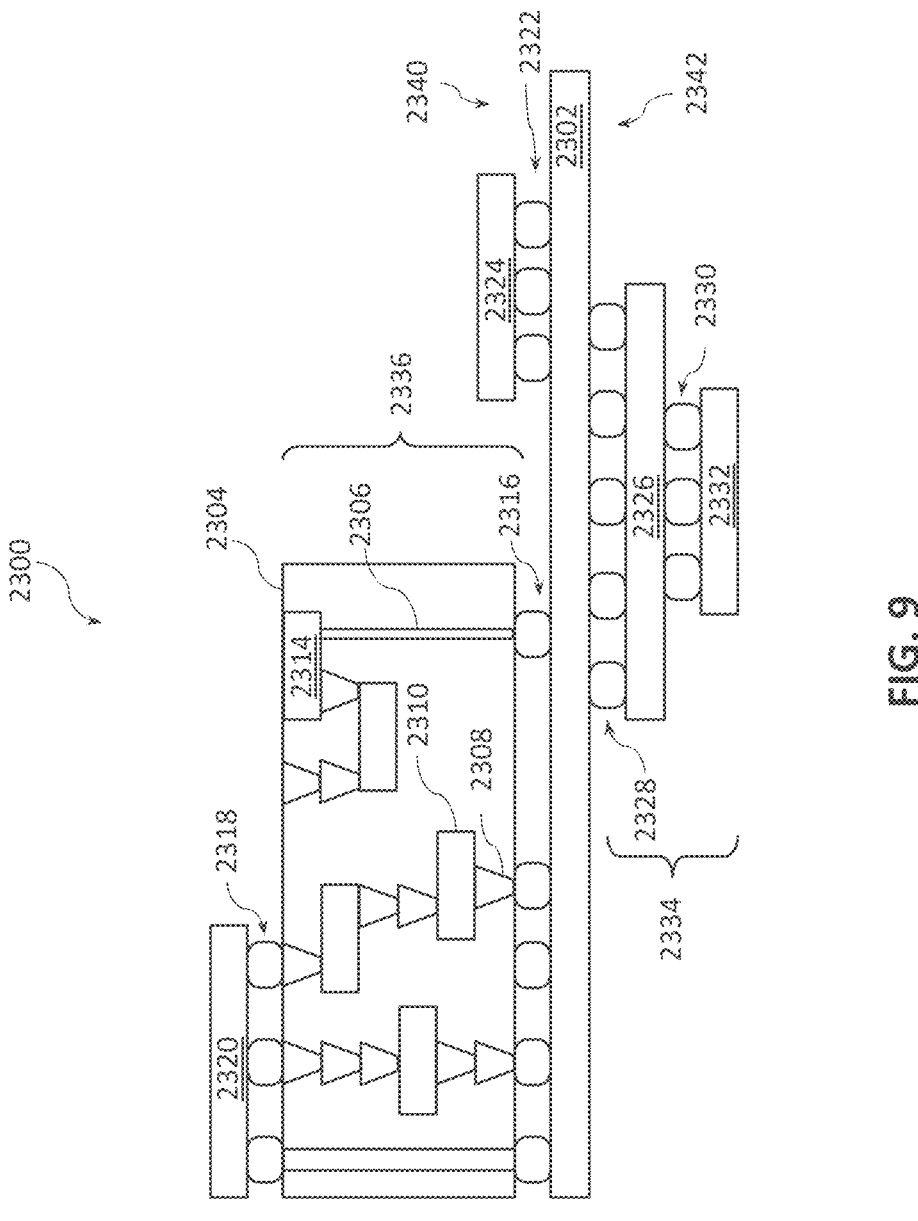
FIG. 9 is a cross-sectional side view of an IC device assembly that may include one or more memory arrays implementing 2T capacitorless memory cells with stacked TFTs in accordance with any of the embodiments disclosed herein.

FIG. 9 is a cross-sectional side view of an IC device assembly 2300 that may include components having one or more 2T capacitorless memory cells with stacked TFTs in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more 2T capacitorless memory cells with stacked TFTs in accordance with any of the embodiments disclosed herein; e.g., any of the IC packages discussed below with reference to the IC device assembly 2300 may take the form of any of the embodiments of the IC package 2200 discussed above with reference to FIG. 8 (e.g., may include one or more 2T capacitorless memory cells with stacked TFTs provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 9 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 9), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 6B), an IC device (e.g., the IC device 100/300), or any other suitable component. In particular, the IC package 2320 may include one or more 2T capacitorless memory cells with stacked TFTs as described herein. Although a single IC package 2320 is shown in FIG. 9, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 9, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 9 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 10:
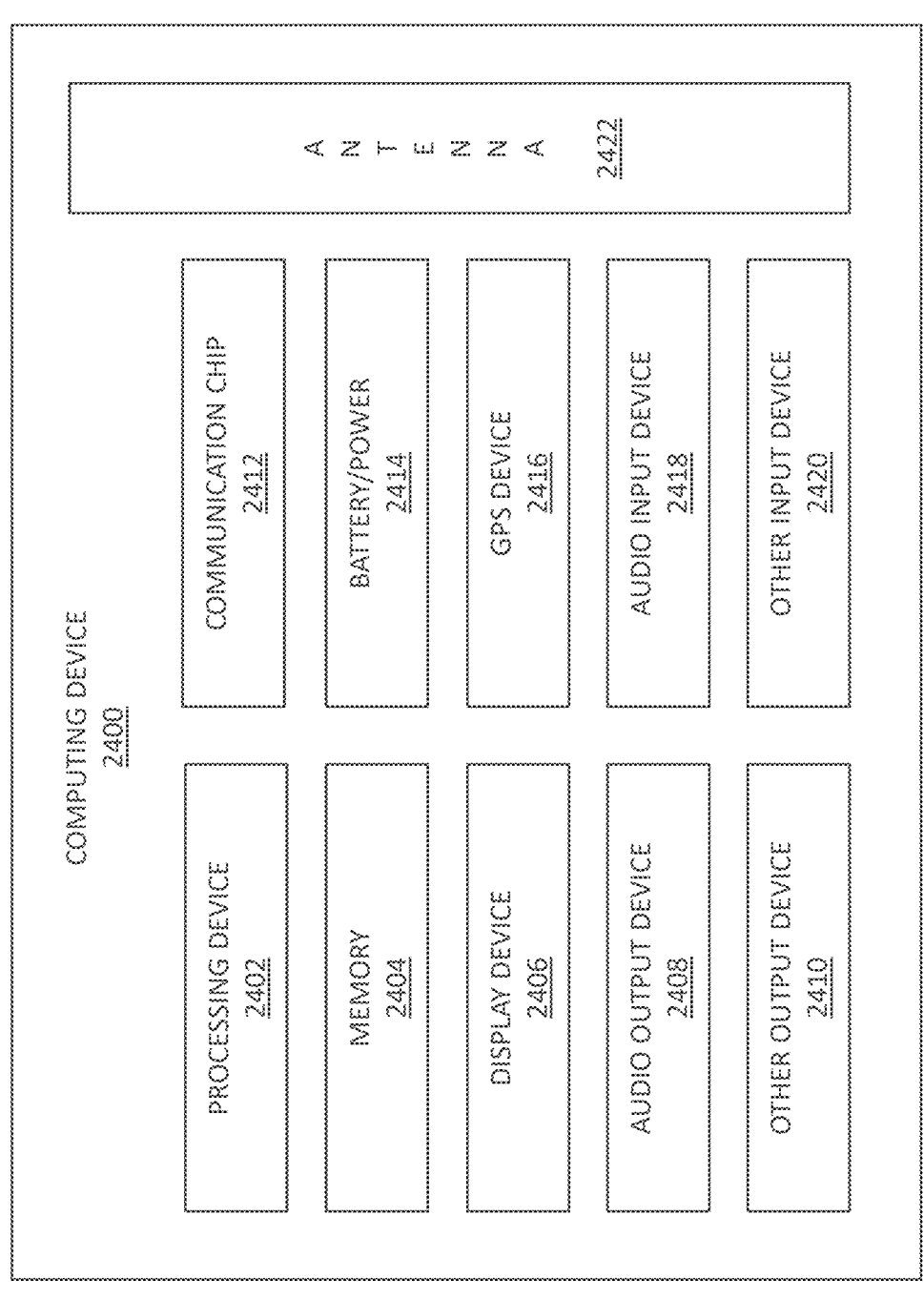
FIG. 10 is a block diagram of an example computing device that may include one or more memory arrays implementing 2T capacitorless memory cells with stacked TFTs in accordance with any of the embodiments disclosed herein.

FIG. 10 is a block diagram of an example computing device 2400 that may include one or more components with one or more 2T capacitorless memory cells with stacked TFTs in accordance with any of the embodiments disclosed herein. For example, any suitable ones of the components of the computing device 2400 may include a die (e.g., the die 2002 of FIG. 6B) including one or more 2T capacitorless memory cells with stacked TFTs in accordance with any of the embodiments disclosed herein. Any of the components of the computing device 2400 may include the IC device 100/300, the IC device 2100 of FIG. 7, any combination of these IC devices, and/or an IC package 2200 of FIG. 8. Any of the components of the computing device 2400 may include an IC device assembly 2300 of FIG. 9.

A number of components are illustrated in FIG. 10 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 10, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include embedded memory, e.g., a memory with 2T capacitorless memory cells with stacked TFTs as described herein, and/or spin transfer torque magnetic random-access memory (STT-MRAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

The following paragraphs provide various examples of the embodiments disclosed herein.

Example 1 provides an IC device that includes a support structure (e.g., a substrate, a die, a wafer, or a chip); and a memory cell provided over the support structure, the memory cell including a first transistor (e.g., a write transistor 210) and a second transistor (e.g., a read transistor 220), the second transistor coupled to the first transistor, where a channel material of the first transistor is in a first layer over the support structure, a channel material of the second transistor is in a second layer over the support structure, where the first layer is between the support structure and the second layer (thus, the second transistor is stacked over the first transistor), and the second transistor includes a first gate stack, coupled to (e.g., in contact with) a portion of a first face of the channel material of the second transistor, and a second gate stack (thus, the second transistor is a dual-gate transistor), coupled to (e.g., in contact with) a portion of a second face of the channel material of the second transistor, where the second face is opposite the first face and is further away from the support structure than the second face.

Example 2 provides the IC device according to example 1, where each of the first transistor and the second transistor includes a source region and a drain region, a first one of the source region and the drain region of the first transistor is coupled to the first gate stack of the second transistor, a second one of the source region and the drain region of the first transistor is coupled to a WBL, a first one of the source region and the drain region of the second transistor is coupled to an RBL, and a second one of the source region and the drain region of the second transistor is coupled to an RWL.

Example 3 provides the IC device according to example 2, where each of the RBL and the RWL is further away from the support structure than the channel material of the second transistor.

Example 4 provides the IC device according to examples 2 or 3, where the channel material of the second transistor is further away from the support structure than the WBL.

Example 5 provides the IC device according to any one of examples 2-4, where the WBL is further away from the support structure than the channel material of the first transistor.

Example 6 provides the IC device according to any one of examples 2-5, where a gate stack of the first transistor is coupled to a WWL.

Example 7 provides the IC device according to example 6, where the channel material of the first transistor is further away from the support structure than the WWL.

Example 8 provides the IC device according to examples 6 or 7, further including a layer including an etch-stop material between the gate stack of the first transistor and the WWL, and a conductive via extending through the layer, where a first end of the conductive via is coupled to (e.g., in contact with) the WWL, and a second end of the conductive via is coupled to (e.g., in contact with) the gate stack of the first transistor.

Example 9 provides the IC device according to any one of the preceding examples, where neither the first one of the source region and the drain region of the first transistor nor the first gate stack of the second transistor is coupled to a deliberately integrated capacitor, e.g., a capacitor having capacitance of at least about 1-20 femtofarad.

Example 10 provides the IC device according to any one of the preceding examples, where at least one of a gate stack of the first transistor, the first gate stack of the second transistor, and the second gate stack of the second transistor includes a ferroelectric (FE) or an antiferroelectric (AFE) material.

Example 11 provides the IC device according to example 10, where each of the gate stack of the first transistor, the first gate stack of the second transistor, and the second gate stack of the second transistor further includes a gate dielectric material and a gate electrode material, and where, for the at least one of the gate stack of the first transistor, the first gate stack of the second transistor, and the second gate stack of the second transistor that includes the FE or the AFE material, the FE or the AFE material is between the gate electrode material and the gate dielectric material.

Example 12 provides the IC device according to example 11, where a thickness of each of the FE or the AFE material and the gate dielectric material is between about 1 and 10 nanometers.

Example 13 provides the IC device according to examples 11 or 12, where the at least one of the gate stack of the first transistor, the first gate stack of the second transistor, and the second gate stack of the second transistor that includes the FE or the AFE material further includes an intermediate layer that includes an electrically conductive material, and where the intermediate layer is between the FE or the AFE material and the gate dielectric material.

Example 14 provides the IC device according to example 13, where the electrically conductive material is a metal.

Example 15 provides the IC device according to examples 13 or 14, where a thickness of the intermediate layer is between about 1 and 10 nanometers.

Example 16 provides the IC device according to any one of the preceding examples, where the channel material of the first transistor includes a thin-film semiconductor material, and the channel material of the second transistor includes a single-crystalline semiconductor material.

Example 17 provides an IC device that includes a support structure (e.g., a substrate, a die, a wafer, or a chip); and a memory cell provided over the support structure, the memory cell including a first transistor (e.g., a write transistor 210) and a second transistor (e.g., a read transistor 220), the second transistor coupled to the first transistor, where a channel material of the first transistor is in a first layer over the support structure and includes a thin-film semiconductor material, a channel material of the second transistor is in a second layer over the support structure and includes a substantially single-crystalline semiconductor material, and the first layer is between the support structure and the second layer. Thus, the first transistor is a TFT, whereas the second transistor, stacked above the TFT is a substantially crystalline transistor, which may be provided above the TFT using layer transfer.

Example 18 provides the IC device according to example 17, where neither the first transistor nor the second transistor is coupled to a deliberately integrated capacitor.

Example 19 provides an IC package that includes an IC device according to any one of the preceding examples; and a further IC component, coupled to the IC device. For example, the IC device may include a support structure (e.g., a substrate, a die, a wafer, or a chip), a first backend layer that includes a first transistor, and a second backend layer that includes a second transistor, where the first backend layer is between the support structure and the second backend layer, the second transistor is coupled to the first transistor, and a channel material of the second transistor includes a substantially single-crystalline semiconductor material.

Example 20 provides the IC package according to example 19, where the further IC component includes one of a package substrate, an interposer, or a further IC die.

In various further examples, the IC device according to any one of the preceding examples may include, or be a part of, at least one of a memory device, a computing device, a wearable device, a handheld electronic device, and a wireless communications device.

Example 21 provides an electronic device that includes a carrier substrate; and one or more of the IC device according to any one of the preceding examples and the IC package according to any one of the preceding examples, coupled to the carrier substrate.

Example 22 provides the electronic device according to example 21, where the carrier substrate is a motherboard.

Example 23 provides the electronic device according to example 21, where the carrier substrate is a PCB.

Example 24 provides the electronic device according to any one of examples 21-23, where the electronic device is a wearable electronic device (e.g., a smart watch) or handheld electronic device (e.g., a mobile phone).

Example 25 provides the electronic device according to any one of examples 21-24, where the electronic device further includes one or more communication chips and an antenna.

Example 26 provides the electronic device according to any one of examples 21-25, where the electronic device is an RF transceiver.

Example 27 provides the electronic device according to any one of examples 21-25, where the electronic device is one of a switch, a power amplifier, a low-noise amplifier, a filter, a filter bank, a duplexer, an upconverter, or a downconverter of an RF communications device, e.g., of an RF transceiver.

Example 28 provides the electronic device according to any one of examples 21-25, where the electronic device is a computing device.

Example 29 provides the electronic device according to any one of examples 21-28, where the electronic device is included in a base station of a wireless communication system.

Example 30 provides the electronic device according to any one of examples 21-28, where the electronic device is included in a user equipment device (i.e., a mobile device) of a wireless communication system.

Example 31 provides a method of fabricating an IC device. The method includes providing a WWL over a support structure (e.g., a substrate, die, wafer, or chip); forming a first transistor over the WWL so that a gate stack of the first transistor is coupled to the WWL; providing a WBL in a layer above the support structure so that a channel material of the first transistor is in a layer that is between the layer with the WBL and the support structure, and so that the WBL is coupled to one of a source region and a drain region of the first transistor; providing a contact coupled to another one of the source region and the drain region of the first transistor so that the channel material of the first transistor is in a layer that is between the contact and the support structure; performing a layer transfer to provide a layer of a substantially single-crystalline semiconductor material over a layer with the contact; and forming a second transistor so that a channel material of the second transistor includes the substantially single-crystalline semiconductor material, where a gate stack of the second transistor is coupled to the contact.

Example 32 provides the method according to example 31, further including providing an RBL coupled to one of a source region and a drain region of the second transistor; and providing an RWL coupled to another one of the source region and the drain region of the second transistor.

Example 33 provides the method according to examples 31 or 32, where forming the first transistor includes providing a layer of a thin-film semiconductor material so that the channel material of the first transistor includes the thin-film semiconductor material.

Example 34 provides the method according to any one of examples 31-33, where the gate stack of the second transistor is a first gate stack, forming the second transistor further includes providing a second gate stack (thus, the second transistor is a dual-gate transistor), the first gate stack is coupled to (e.g., is in contact with) a portion of a first face of the channel material of the second transistor, and the second gate stack is coupled to (e.g., is in contact with) a portion of a second face of the channel material of the second transistor, where the second face is opposite the first face and is further away from the support structure than the second face.

Example 35 provides the method according to any one of examples 31-34, further including processes for forming the IC device according to any one of the preceding examples (e.g., for forming the IC device according to any one of examples 1-18).

Example 36 provides the method according to any one of examples 31-35, further including processes for forming the IC package according to any one of the preceding examples (e.g., for forming the IC package according to any one of examples 19-20).

Example 37 provides the method according to any one of examples 31-36, further including processes for forming the electronic device according to any one of the preceding examples (e.g., for forming the electronic device according to any one of examples 21-30).

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
a support structure; and
a memory cell over the support structure, the memory cell including a first transistor and a second transistor, wherein:
a first channel material of the first transistor is in a first layer over the support structure,
a second channel material of the second transistor is in a second layer over the support structure, where the first layer is between the support structure and the second layer,
the second transistor includes:
a first gate stack, coupled to a portion of a first face of the second channel material of the second transistor, and
a second gate stack, coupled to a portion of a second face of the second channel material of the second transistor, where the second face is opposite the first face and is further away from the support structure than the second face,
each of the first transistor and the second transistor includes a source region and a drain region,
a first one of the source region and the drain region of the first transistor is coupled to the first gate stack of the second transistor,
a second one of the source region and the drain region of the first transistor is coupled to a write bit-line (WBL),
a first one of the source region and the drain region of the second transistor is coupled to a read bit-line (RBL), and
a second one of the source region and the drain region of the second transistor is coupled to a read word-line (RWL).

2. The IC device according to claim 1, wherein each of the RBL and the RWL is further away from the support structure than the second channel material of the second transistor.

3. The IC device according to claim 1, wherein the second channel material of the second transistor is further away from the support structure than the WBL.

4. The IC device according to claim 1, wherein the WBL is further away from the support structure than the first channel material of the first transistor.

5. The IC device according to claim 1, wherein a gate stack of the first transistor is coupled to a write word-line (WWL).

6. The IC device according to claim 5, wherein the first channel material of the first transistor is further away from the support structure than the WWL.

7. The IC device according to claim 5, further comprising:
a layer comprising an etch-stop material between the gate stack of the first transistor and the WWL, and
a conductive via extending through the layer, where a first end of the conductive via is coupled to the WWL, and a second end of the conductive via is coupled to the gate stack of the first transistor.

8. The IC device according to claim 1, wherein neither the first one of the source region and the drain region of the first transistor nor the first gate stack of the second transistor is coupled to a capacitor.

9. The IC device according to claim 1, wherein at least one of a gate stack of the first transistor, the first gate stack of the second transistor, and the second gate stack of the second transistor includes a ferroelectric (FE) or an antiferroelectric (AFE) material.

10. The IC device according to claim 1, wherein:
the first channel material of the first transistor includes a thin-film semiconductor material, and
the second channel material of the second transistor includes a substantially single-crystalline semiconductor material.

11. An integrated circuit (IC) device, comprising:
a support structure; and
a memory cell over the support structure, the memory cell including a first transistor and a second transistor, wherein:
    a first channel material of the first transistor is in a first layer over the support structure and includes a thin-film semiconductor material,
    a second channel material of the second transistor is in a second layer over the support structure and includes a substantially single-crystalline semiconductor material,
    the first layer is between the support structure and the second layer,
    each of the first transistor and the second transistor includes a source region and a drain region,
    a first one of the source region and the drain region of the first transistor is coupled to a gate stack of the second transistor,
    a second one of the source region and the drain region of the first transistor is coupled to a first control line,
    a first one of the source region and the drain region of the second transistor is coupled to a second control line, and
    a second one of the source region and the drain region of the second transistor is coupled to a third control line.

12. The IC device according to claim 11, wherein neither the first transistor nor the second transistor is coupled to a capacitor.

13. The IC device according to claim 11, wherein the gate stack of the second transistor is a first gate stack of the second transistor and the second transistor further includes a second gate stack, wherein:
    the first gate stack is coupled to a portion of a first face of the second channel material of the second transistor,
    the second gate stack is coupled to a portion of a second face of the second channel material of the second transistor, and
    the second face is opposite the first face and is further away from the support structure than the second face.

14. The IC device according to claim 11, wherein:
the first control line is a write bit-line (WBL),
the second control line is a read bit-line (RBL), and
the third control line is a read word-line (RWL).

15. The IC device according to claim 11, wherein the support structure is a substrate.

16. An integrated circuit (IC) device, comprising:
a substrate; and
a memory cell over the substrate, the memory cell including a first transistor and a second transistor, wherein:

the first transistor includes a first semiconductor material in a first layer over the substrate,
    the second transistor includes a second semiconductor material in a second layer over the substrate,
    the first layer is between the substrate and the second layer,
    the second transistor is a dual-gate transistor,
    each of the first transistor and the second transistor includes a source region and a drain region,
    a first one of the source region and the drain region of the first transistor is coupled to a gate stack of the second transistor,
    a second one of the source region and the drain region of the first transistor is coupled to a first control line,
    a first one of the source region and the drain region of the second transistor is coupled to a second control line, and
    a second one of the source region and the drain region of the second transistor is coupled to a third control line.

17. The IC device according to claim 16, wherein the gate stack of the second transistor is a first gate stack of the second transistor and the second transistor further includes a second gate stack, wherein:
    the first gate stack is coupled to a portion of a first face of the second semiconductor material,
    the second gate stack is coupled to a portion of a second face of the second semiconductor material, and,
    the second face is opposite the first face and is further away from the substrate than the second face.

18. The IC device according to claim 9, wherein:
    each of the gate stack of the first transistor, the first gate stack of the second transistor, and the second gate stack of the second transistor further includes a gate dielectric material and a gate electrode material, and
    for the at least one of the gate stack of the first transistor, the first gate stack of the second transistor, and the second gate stack of the second transistor that includes the FE or the AFE material, the FE or the AFE material is between the gate electrode material and the gate dielectric material.

19. The IC device according to claim 18, wherein:
    the at least one of the gate stack of the first transistor, the first gate stack of the second transistor, and the second gate stack of the second transistor that includes the FE or the AFE material further includes an intermediate layer that includes an electrically conductive material, and
    the intermediate layer is between the FE or the AFE material and the gate dielectric material.

20. The IC device according to claim 19, wherein the electrically conductive material is a metal.

* * * * *